United States Patent
Lippincott (10) Patent No.: US 7,865,863 B2
(45) Date of Patent: Jan. 4, 2011

(54) OPC CONFLICT IDENTIFICATION AND EDGE PRIORITY SYSTEM

(75) Inventor: George P. Lippincott, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 732 days.

(21) Appl. No.: 11/626,307

(22) Filed: Jan. 23, 2007

(65) Prior Publication Data

US 2007/0118826 A1      May 24, 2007

Related U.S. Application Data

(62) Division of application No. 10/859,920, filed on Jun. 2, 2004, now Pat. No. 7,240,305.

(51) Int. Cl.
*G06F 17/50* (2006.01)

(52) U.S. Cl. ............ 716/19; 716/5; 716/20; 716/21

(58) Field of Classification Search ............ 716/5, 716/19–21; 430/5, 22, 30
See application file for complete search history.

(56) References Cited

U.S. PATENT DOCUMENTS

| | | | |
|---|---|---|---|
| 4,532,650 A | | 7/1985 | Wihl et al. |
| 4,762,396 A | | 8/1988 | Dumant et al. |
| 5,297,150 A | * | 3/1994 | Clark ............ 714/26 |
| 5,396,584 A | | 3/1995 | Lee et al. |
| 5,473,748 A | * | 12/1995 | Date et al. ........ 345/536 |
| 5,502,654 A | | 3/1996 | Sawahata |
| 5,655,110 A | | 8/1997 | Krivokapic et al. |
| 5,723,233 A | | 3/1998 | Garza et al. |
| 5,815,685 A | | 9/1998 | Kamon |
| 5,825,647 A | | 10/1998 | Tsudaka |
| 5,879,844 A | | 3/1999 | Yamamoto et al. |
| 5,991,006 A | | 11/1999 | Tsudaka |
| 6,016,357 A | | 1/2000 | Neary et al. |
| 6,033,814 A | | 3/2000 | Burdorf et al. |
| 6,042,257 A | | 3/2000 | Tsudaka |
| 6,049,660 A | | 4/2000 | Ahn et al. |
| 6,077,310 A | | 6/2000 | Yamamoto et al. |
| 6,080,527 A | | 6/2000 | Huang et al. |
| 6,120,952 A | | 9/2000 | Pierrat et al. |
| 6,128,067 A | | 10/2000 | Hashimoto |

(Continued)

FOREIGN PATENT DOCUMENTS

JP         09319067 A         12/1997

(Continued)

OTHER PUBLICATIONS

Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).

Cobb et al., "New Concepts in OPC," *Proceedings of SPIE: Optical Microlithography XVII*, vol. 5377, pp. 680-690 (Feb. 24, 2004).

Cobb et al., "OPC Methods to Improve Image Slope and Process Window," *Proceedings of SPIE: Design and Process Integration for Microelectronic Manufacturing*, vol. 5042, pp. 116-125 (Feb. 27, 2003).

(Continued)

*Primary Examiner*—Paul Dinh
(74) *Attorney, Agent, or Firm*—Klarquist Sparkman, LLP (57) ABSTRACT

An integrated circuit verification system provides an indication of conflicts between an OPC suggested correction and a manufacturing rule. The indication specifies which edge segments are in conflict so that a user may remove the conflict to achieve a better OPC result. In another embodiment of the invention, edge segments are assigned a priority such that the correction of a lower priority edge does not hinder a desired OPC correction of a higher priority edge.

17 Claims, 7 Drawing Sheets

U.S. PATENT DOCUMENTS

| | | | |
|---|---|---|---|
| 6,187,483 B1 | 2/2001 | Capodieci et al. | |
| 6,243,855 B1 | 6/2001 | Kobayashi et al. | |
| 6,249,904 B1 | 6/2001 | Cobb | |
| 6,263,299 B1 | 7/2001 | Aleshin et al. | |
| 6,269,472 B1 | 7/2001 | Garza et al. | |
| 6,301,697 B1 | 10/2001 | Cobb | |
| 6,317,859 B1 | 11/2001 | Papadopoulou | |
| 6,370,679 B1 | 4/2002 | Chang et al. | |
| 6,425,117 B1 | 7/2002 | Pasch et al. | |
| 6,430,737 B1 | 8/2002 | Cobb et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,470,489 B1 | 10/2002 | Chang et al. | |
| 6,499,003 B2 | 12/2002 | Jones et al. | |
| 6,574,784 B1 | 6/2003 | Lippincott et al. | |
| 6,643,616 B1 | 11/2003 | Granik et al. | |
| 6,649,309 B2 | 11/2003 | Mukherjee | |
| 6,665,845 B1 | 12/2003 | Aingaran et al. | |
| 6,668,367 B2 | 12/2003 | Cobb et al. | |
| 6,704,921 B2 | 3/2004 | Liu | |
| 6,748,578 B2 | 6/2004 | Cobb | |
| 6,792,590 B1 | 9/2004 | Pierrat et al. | |
| 6,817,003 B2 | 11/2004 | Lippincott et al. | |
| 6,857,109 B2 | 2/2005 | Lippincott | |
| 6,887,633 B2 | 5/2005 | Tang | |
| 6,899,981 B1 | 5/2005 | Galan et al. | |
| 6,928,634 B2 | 8/2005 | Granik et al. | |
| 6,973,633 B2 | 12/2005 | Lippincott et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,047,516 B2 | 5/2006 | Futatsuya | |
| 7,062,748 B2 | 6/2006 | Mellmann | |
| 7,073,162 B2 | 7/2006 | Cobb et al. | |
| 7,155,689 B2 | 12/2006 | Pierrat et al. | |
| 7,155,699 B2 | 12/2006 | Cobb | |
| 7,172,838 B2 | 2/2007 | Maurer et al. | |
| 7,181,721 B2 | 2/2007 | Lippincott et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,281,234 B2 | 10/2007 | Lippincott | |
| 7,293,249 B2 | 11/2007 | Torres Robles et al. | |
| 7,324,930 B2 | 1/2008 | Cobb | |
| 7,367,009 B2 | 4/2008 | Cobb et al. | |
| 2002/0140920 A1 | 10/2002 | Rosenbluth et al. | |
| 2004/0063000 A1 | 4/2004 | Maurer et al. | |
| 2004/0133871 A1* | 7/2004 | Granik et al. | 716/19 |
| 2005/0076316 A1 | 4/2005 | Pierrat et al. | |
| 2005/0149901 A1 | 7/2005 | Tang | |
| 2005/0229130 A1* | 10/2005 | Wu et al. | 716/8 |
| 2005/0229131 A1* | 10/2005 | Wu et al. | 716/8 |
| 2005/0251771 A1 | 11/2005 | Robles | |
| 2005/0273733 A1 | 12/2005 | Lippincott | |
| 2005/0278686 A1 | 12/2005 | Word et al. | |
| 2006/0188796 A1 | 8/2006 | Word | |
| 2006/0199084 A1 | 9/2006 | Word | |
| 2006/0200790 A1 | 9/2006 | Shang et al. | |
| 2006/0240342 A1 | 10/2006 | Tang | |
| 2007/0074143 A1 | 3/2007 | Cobb et al. | |
| 2007/0118826 A1 | 5/2007 | Lippincott | |
| 2007/0124708 A1 | 5/2007 | Torres Robles et al. | |
| 2008/0141195 A1 | 6/2008 | Torres Robles et al. | |

FOREIGN PATENT DOCUMENTS

| | | |
|---|---|---|
| JP | 11-102380 A | 4/1999 |
| JP | 2004-502961 A | 1/2004 |
| WO | WO 99/14637 A1 | 3/1999 |
| WO | WO 99/14638 | 3/1999 |
| WO | WO 01/65315 A2 | 9/2001 |
| WO | WO 01/97096 A1 | 12/2001 |

OTHER PUBLICATIONS

Granik, "New Process Models for OPC at sub-90nm Nodes," *Proceedings of SPIE: Optical Microlithography XVI*, vol. 5040, pp. 1166-1175 (Feb. 25, 2003).

Granik et al., "Universal process modeling with VTRE for OPC," *Proceedings of SPIE: Optical Microlithography XV*, vol. 4691, pp. 377-394 (Mar. 5, 2002).

Schellenberg, "Sub-Wavelength Lithography Using OPC," *Semiconductor Fabtech*, 9th ed., pp. 205-209 (Mar. 1999).

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Sep. 30-Oct. 4, 2002, p. 147.

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE, vol. 2440: Symposium on Optical/Laser Microlithography VIII*, Santa Clara, Calif, Feb. 22-24, 1995, pp. 313-327.

Cobb, N., and A. Zakhor, "Fast Sparse Aerial Image Calculation for OPC," *Proceedings of SPIE, vol. 2621: 15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE, vol. 2197: Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE, vol. 2726: Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE, vol. 5130: Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE, vol. 4562: 21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE, vol. 4754: Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE, vol. 3334: Optical Microlithography XI*, Santa Clara, Calif, Feb. 22-27, 1998, pp. 245-253.

Maurer, W., et al., "Evaluation of a Fast and Flexible OPC Package: Optissimo," *Proceedings of SPIE, vol. 2884: 16th Annual Symposium on Photomask Technology and Management*, Redwood City, Calif., Sep. 18-20, 1996, pp. 412-418.

Mentor Graphics Corporation, News & Views, Mar. 1999, <http://www.mentorg.co.jp/N-V/99_3/dsm.html> [retrieved Nov. 7, 2006].

Mentor Graphics Corporation, News & Views, Mar. 1999, <http://www.mentorg.co.jp/N-V/99_3/opc.html> [retrieved Nov. 7, 2006].

Mentor Graphics Corporation, News & Views, Apr. 2000, <http://www.mentorg.co.jp/N-V/00_04/ppower.html> [retrieved Nov. 7, 2006].

Ohnuma, H., et al., "Lithography Computer Aided Design Technology for Embedded Memory in Logic," *Japanese Journal of Applied Physics 37*(12B):6686-6688, Dec. 1998.

\* cited by examiner

OPC CONFLICT IDENTIFICATION AND EDGE PRIORITY SYSTEM

CROSS-REFERENCE TO RELATED APPLICATION

This application is a divisional of U.S. patent application Ser. No. 10/859,920, filed Jun. 2, 2004, now U.S. Pat. No. 7,240,305.

FIELD OF THE INVENTION

The present invention relates to integrated circuit verification systems, and in particular, to optical and process correction (OPC) tools.

BACKGROUND OF THE INVENTION

As the density of features to be created in an integrated circuit (IC) increases and the size of individual features decrease, such features are increasingly more difficult to accurately form with a photolithographic process. It is a well documented phenomenon in photolithographic processing that as a feature size becomes smaller than the wavelength of the light that is used to illuminate a mask or reticle pattern onto a wafer, the fringing effects of the illumination light produce errors on the wafer. Such errors distort the patterns created on a wafer in a manner that may decrease the performance of the resulting IC or cause it to fail completely.

To reduce or eliminate the illumination distortion, circuit designers use a variety of techniques including the use of optical and process correction (OPC) tools that, in effect, counteract the illumination distortions so that a feature will print as desired on the wafer. One example of an OPC correction tool is the Calibre® Software Suite, produced by Mentor Graphics Corporation of Wilsonville, Oreg., the assignee of the present invention.

Even when using an OPC tool, some features in an IC design may not print as desired on a wafer. In many instances, a less than desired OPC correction is made by the OPC tool due to manufacturing constraints that can affect the OPC tool in a non-intuitive manner. In these instances, users sometimes send test cases to the OPC software developers who debug the OPC software to determine why the less than optimal correction was made. A process of manual debugging takes time, increases the cost and decreases the throughput of overall circuit design process.

Given these problems, there is a need for a system that can alert a user when a less than desired OPC correction is being made and why a better correction is not possible under current system constraints.

SUMMARY OF THE INVENTION

The present invention is a tool for alerting a user to conflicts between an optical and process correction (OPC) tool and other system constraints that are preventing a better OPC correction from being made for a feature in an IC layout. Such system constraints are typically user-defined or are process dependent. Upon receiving the alert, the user may be able to change the layout or relax or suspend the system constraint in order to achieve a better OPC result.

In another embodiment of the invention, an OPC tool assigns a priority to individual edge segments of a feature to be OPC corrected such that movement of a less important edge does not hinder the OPC correction of a more important edge. Pattern recognition or other techniques are used to assign the priority of an edge so that a better OPC result can be obtained.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF A PREFERRED EMBODIMENT

Figure 1:
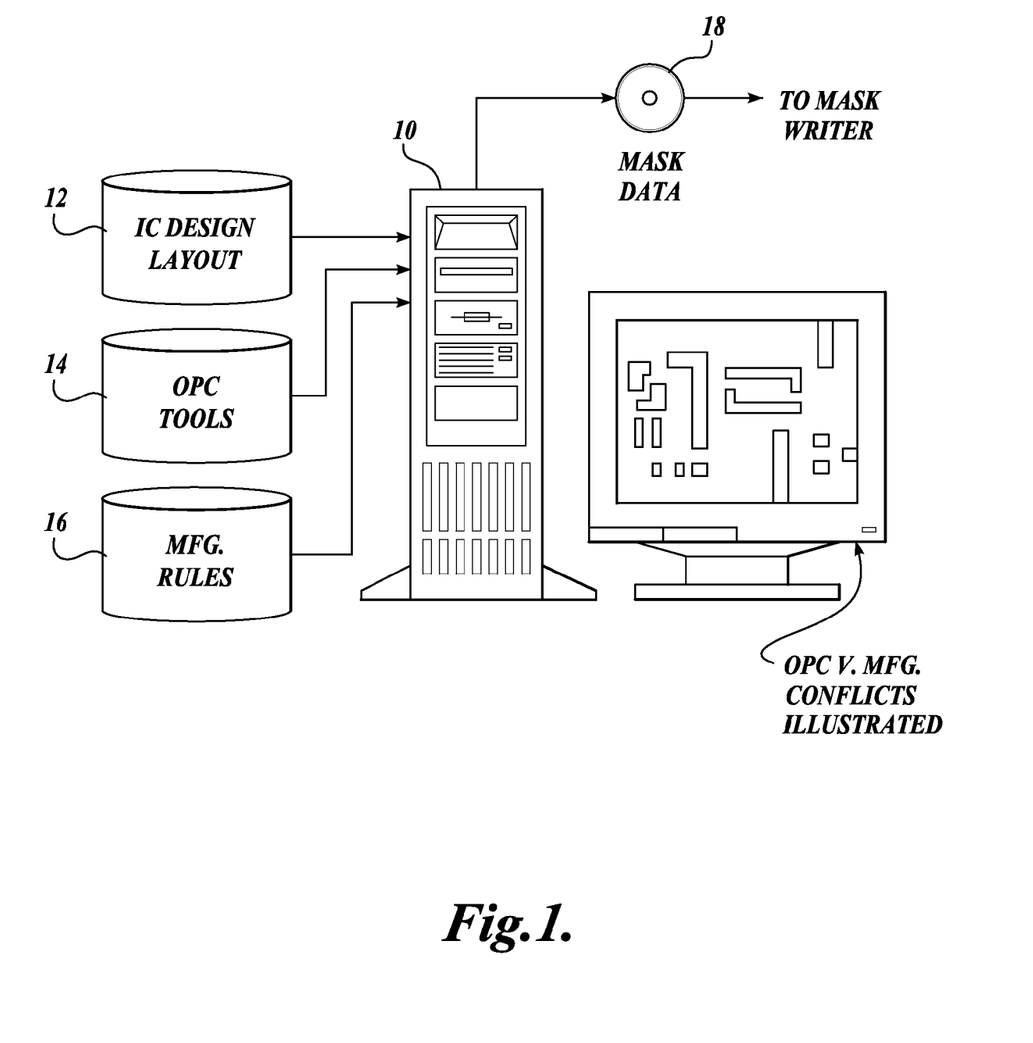
FIG. 1 illustrates a system for performing IC layout data verification including an OPC conflict visualization system and an edge priority determination system in accordance with embodiments of the present invention.

As indicated above, one aspect of the present invention is a system for performing IC layout data verification that alerts a circuit designer where an optical and process correction (OPC) tool may produce a less than optimal result due to a conflict with other system constraints. As shown in FIG. 1, the layout verification system includes a computer system 10 that receives data from a file 12 containing an IC layout design. The IC layout data may be in a standard layout language such as GDS II, OASIS, or other known formats for describing an IC layout design. In a GDS II layout file, each feature to be created on a wafer is described as a number of vertices that define a polygon outlining the shape of the feature or other structure such as a phase shifter, assist bar, etc., to be created in the circuit. The computer system 10 verifies the layout design with the use of a number of software tools including an OPC tool 14. The OPC tool 14 attempts to modify the edges of the polygons in order to improve their ability to be printed on a wafer. Furthermore, computer system 10 receives a number of manufacturing rules 16 that are either user-defined or depend on the photolithographic process used to create the IC. Such manufacturing rules 16 can include the critical distance of the circuit design, the minimum horizontal, vertical or diagonal distance between features on the wafer or on a mask, etc.

In accordance with one aspect of the present invention, the computer system 10 executes a sequence of programmed instructions that are stored on a computer readable media or embedded in a data signal transmitted over a datalink. The instructions cause the computer to indicate to a user where there is a conflict between an OPC suggested modification and a manufacturing rule 16 in the IC layout design. The indication allows a user to readily determine where a less than optimal OPC result is being selected for a feature unless a modification is made. Upon viewing the conflict, the user can either accept the OPC result suggested, elect to modify the layout design or relax or suspend the particular rule that is causing the conflict in order to obtain a better OPC result.

In accordance with another embodiment of the present invention, the computer system 10 assigns a priority to certain edge segments of polygons within the IC layout design such that the OPC correction of a lower priority edge segment does not hinder the OPC correction of a higher priority edge segment. Upon completion of the OPC and other design verification tools, the computer system writes the verified and corrected layout data onto a computer-readable media 18. The computer readable media 18 is provided to a mask or reticle writer in order to create a corresponding photolithographic mask or reticle, which is then used in a photolithographic process to produce the IC on a semiconductor wafer. Alternatively, the corrected IC layout data could be transmitted over a data network such as an intranet or the Internet to the mask writer. Although the computer system 10 is shown as a single stand-alone computer, it will be appreciated that a multi-computer or distributed computer network could also be used to implement the present invention.

Figure 2:
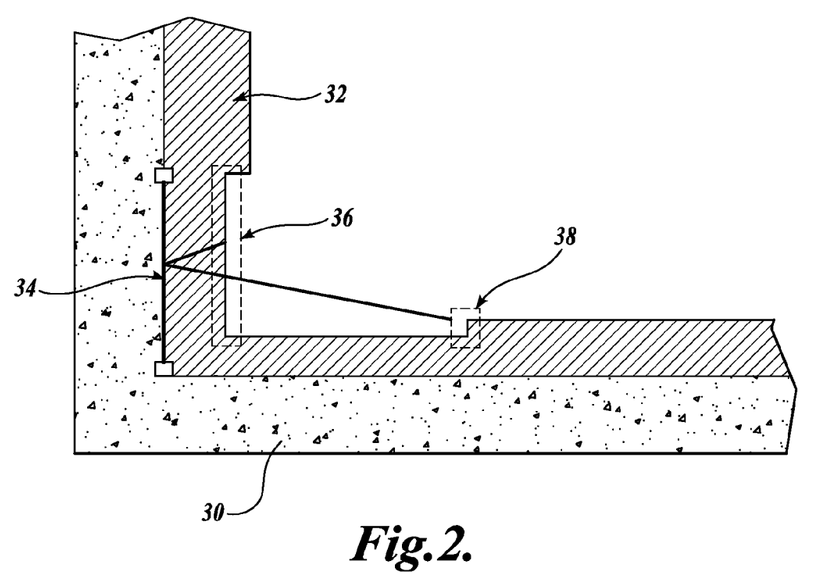
FIG. 2 illustrates one example of a conflict between an OPC suggested correction of an edge segment and a mask rule constraint (MRC) in an IC layout.

FIG. 2 illustrates one example of a conflict between an OPC suggested modification to an edge segment and a mask rule constraint (MRC) that specifies how close features can be printed on a mask by a mask writing tool. In the example shown, a portion of a feature to be created on a wafer has an initial dimension as indicated in the stippled area 30. In order to get the feature to print properly on a wafer, the OPC tool suggests that the boundaries of the feature be extended outwards as indicated by the dashed area 32. In the example shown, an edge segment 34 of the feature is illustrated as being able to be moved by the OPC tool to a position 36 before creating a conflict with an edge segment that forms a jog at position 38. That is, if the OPC tool moves the edge segment 34 further outwards, the distance between the edge segment 34 and the jog at position 38 violates an MRC. By highlighting the edge segment 34 and the edge segments at positions 36 and 38 on a computer monitor or other device such as a printer, the circuit designer is able to see that the edge segment 34 will be assigned a less than desired OPC correction. To solve the problem, the user can re-fragment the area of the feature around the concave corner of the feature such that the distance between the final OPC corrected position for edge segment 34 and the notch 38 is greater than the minimum distance allowed by the MRC. Alternatively, the user may decide to relax or suspend the MRC in order to permit the desired OPC correction for edge segment 34 to be obtained.

Figure 3A:
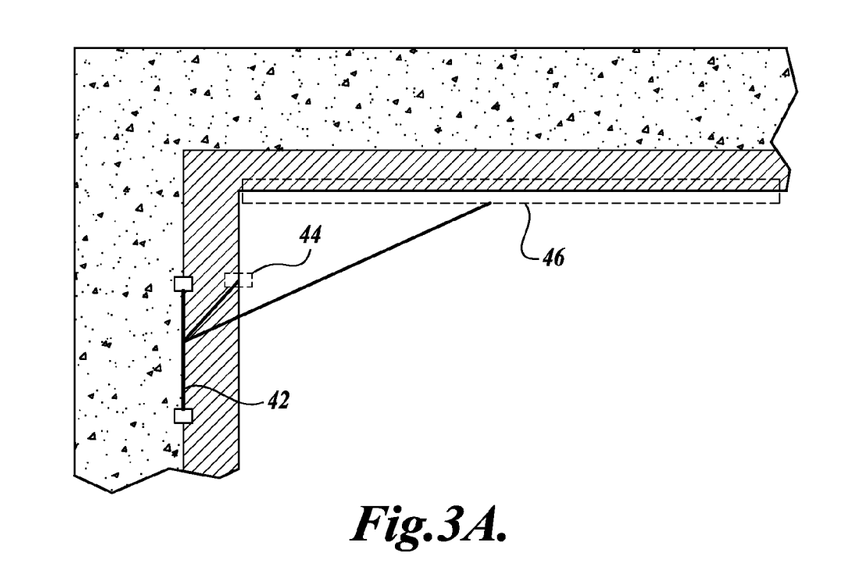
FIGS. 3A and 3B illustrate another example of an OPC versus MRC conflict in an IC layout.
Figure 3B:
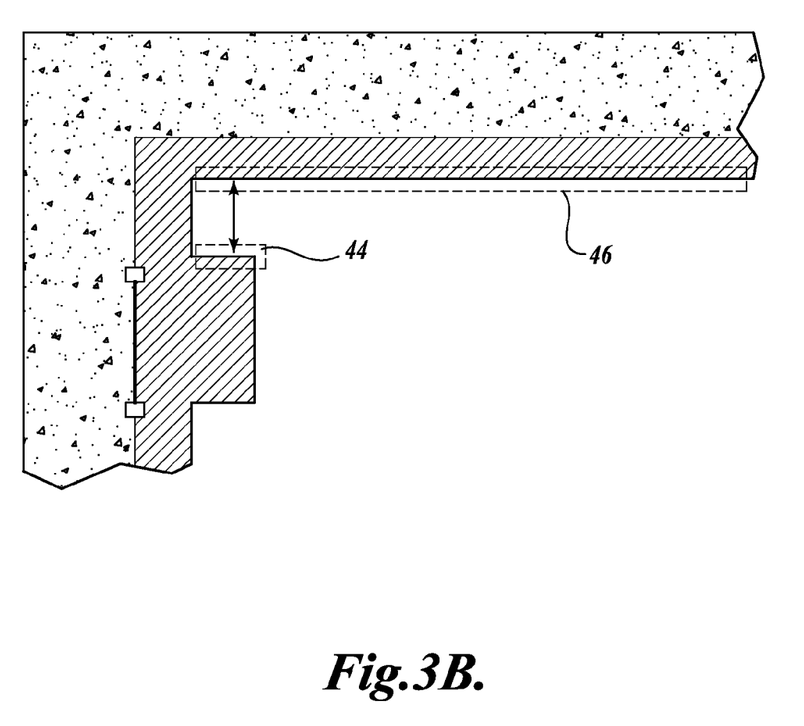

FIGS. 3A and 3B illustrate another example of a suggested OPC correction that is not permitted due to a conflict with a manufacturing rule. In the example shown in FIG. 3A, edge segment 42 is highlighted as being able to be moved by the OPC tool to a position 44 before producing a conflict between an edge segment that would be created if the edge segment 42 would be moved even further, and an edge segment at position 46. As shown in FIG. 3B, if the edge segment 42 is moved to its desired OPC corrected position, the vertical distance between the edge segment created at position 44 and the edge segment at position 46 is less than a minimum distance required by an MRC. To solve this problem, the user can either relax or suspend the MRC or can re-fragment the concave corner of the feature in order to allow a better OPC result to be obtained.

To provide an indication of OPC and manufacturing rule conflicts, the computer system 10 keeps track of which edges can not be moved to their desired OPC corrected position without causing a conflict. A script, datafile, database or other mechanism for storing instructions that are executed by the computer to produce a display that highlights the edge segments in question and where the conflict will occur if additional OPC corrections are made. By viewing the display, the user can easily check a layout design for edge segments that are not given their desired OPC correction, and a decision can be made regarding how to better the result if necessary. In addition, the conflict indication given to the user may also specify what manufacturing rule or rules would be violated by giving the edge segment its desired, or additional, OPC correction so that the user can modify or suspend the rule if desired.

Once the conflict results have been determined, the actual display of the conflict results can be any one of those widely employed currently by layout display tools. For example, a bounding box of contrasting color can be drawn around the edge segment found to have a conflict. The edge segment can also be made to blink on and off, drawing attention to the location. A text box describing the rule causing the conflict can also be made to appear near the edge segment in question as an additional means of identifying the conflict locations. This text information can also be hidden, appearing only when a user's on screen indicator of the computer mouse position is moved into close proximity to the edge segment in question. The text can indicate a rule number, a rule name, or any other information used to identify and index the various design rules that may be in conflict. Different colors for the bounding boxes around the edge segments in violation can also be used to indicate different specific rules that are in conflict.

Figure 4:
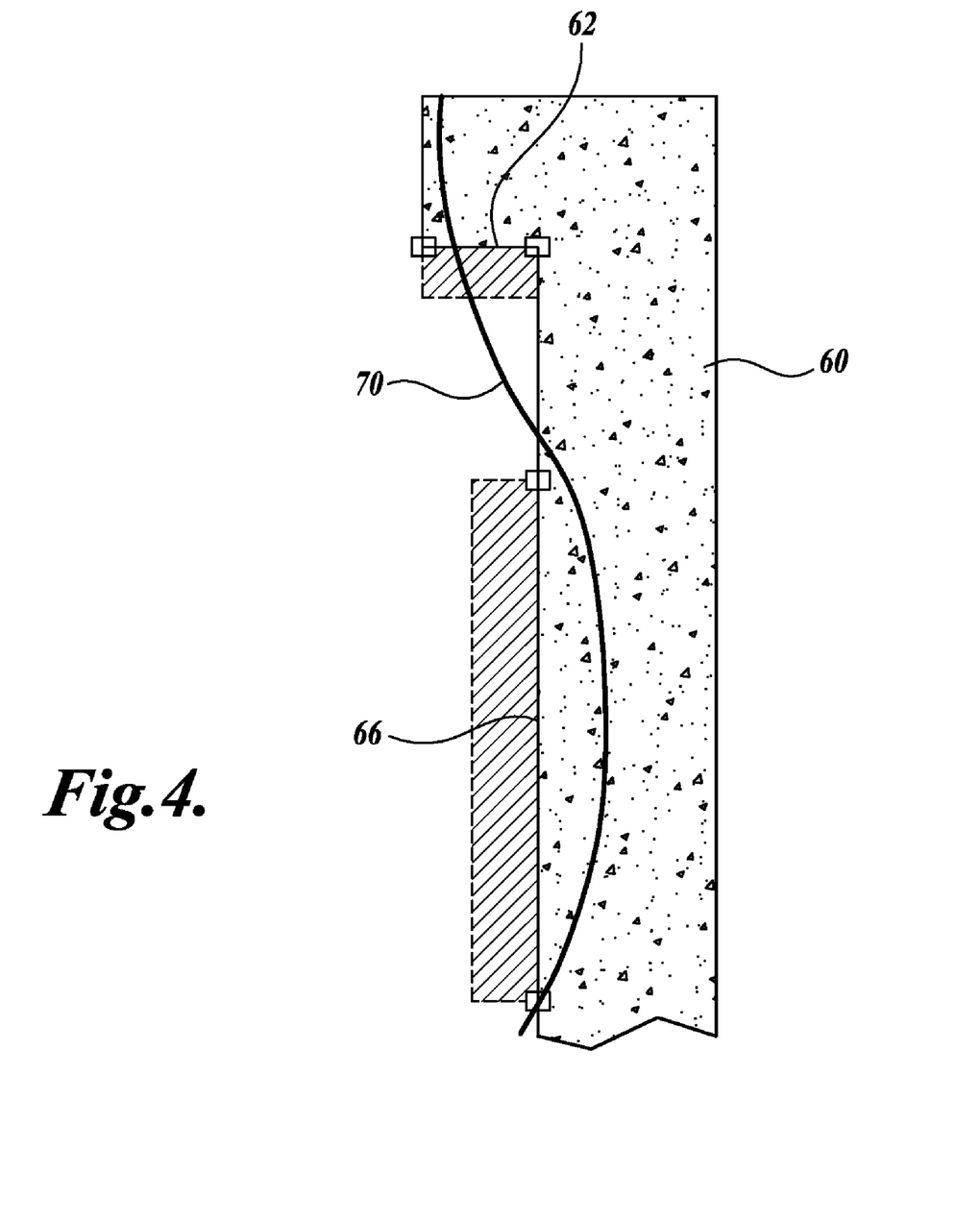
FIG. 4 illustrates a conflict between a pair of edges having equal priority in an IC layout.

FIG. 4 illustrates another aspect of the present invention. In many cases, the OPC correction of a less important edge segment in an IC layout design may hinder the OPC correction of a more important edge segment. For example, FIG. 4 shows a portion of a feature 60 having a horizontal edge segment 62 and a vertical edge segment 66 that need OPC correction. A simulation of where the edges will print is indicated by a curving line 70. As will be appreciated, the line 70 extends away from the concave corner that includes the edge segment 62 and into the area of the feature 60 adjacent the edge segment 66. To improve the edge placement error (EPE) of those edge segments, an OPC tool will attempt to move the horizontal edge segment 62 downward and vertical edge segment 66 outward and to the left. However, if both these movements take place, the vertical distance between the edge segment 62 in its desired OPC corrected position and the corrected position of edge segment 66 may violate one or more manufacturing rules. Because the narrowing or pinching of the feature 60 in the area of the edge segment 66 may contribute to a circuit failure if not adequately addressed, is more important to correct the EPE in the area of the edge segment 66 than it is to correct the EPE of the horizontal edge segment 62. Therefore, one embodiment of the present invention assigns a higher priority to the edge segment 66 than to the edge segment 62. The edge segment 66 is allowed to move to its desired OPC corrected position while edge segment 62 is prohibited from moving. Thereafter, edge segment 62 can be moved to the best position possible that does not conflict with the corrected position of the edge segment 66. Alternatively, the edge segment 62 may not be moved at all.

To determine which edge segments have priority over other edge segments, a search algorithm and/or a knowledge base is used to search the layout for patterns of features whereby the priority of similarly positioned edge segments have been determined in the past. However, there are other ways of assigning priority to edges. For example, one embodiment may estimate the magnitude of the uncorrected EPE of an edge segment such that edge segments having a larger error may be corrected prior to adjusting edge segments with a smaller estimated EPE. Furthermore, the EPE used for assigning priorities may be dynamic in accordance with the OPC corrections made to the edge segments. In another embodiment, edge segments can be categorized or tagged based on their location in a feature or with their MRC constraint information. For example, segments may be categorized as being part of a gate, a line end, a signal wire, etc., so that critical portions of circuit features are corrected before non-critical or less critical portions of circuit elements. In an alternative embodiment, the function of the feature may be used in assigning priorities. For example, edge segments that define gates of transistors may be assigned a higher priority than edge segments that define connection pads etc.

Figure 5A:
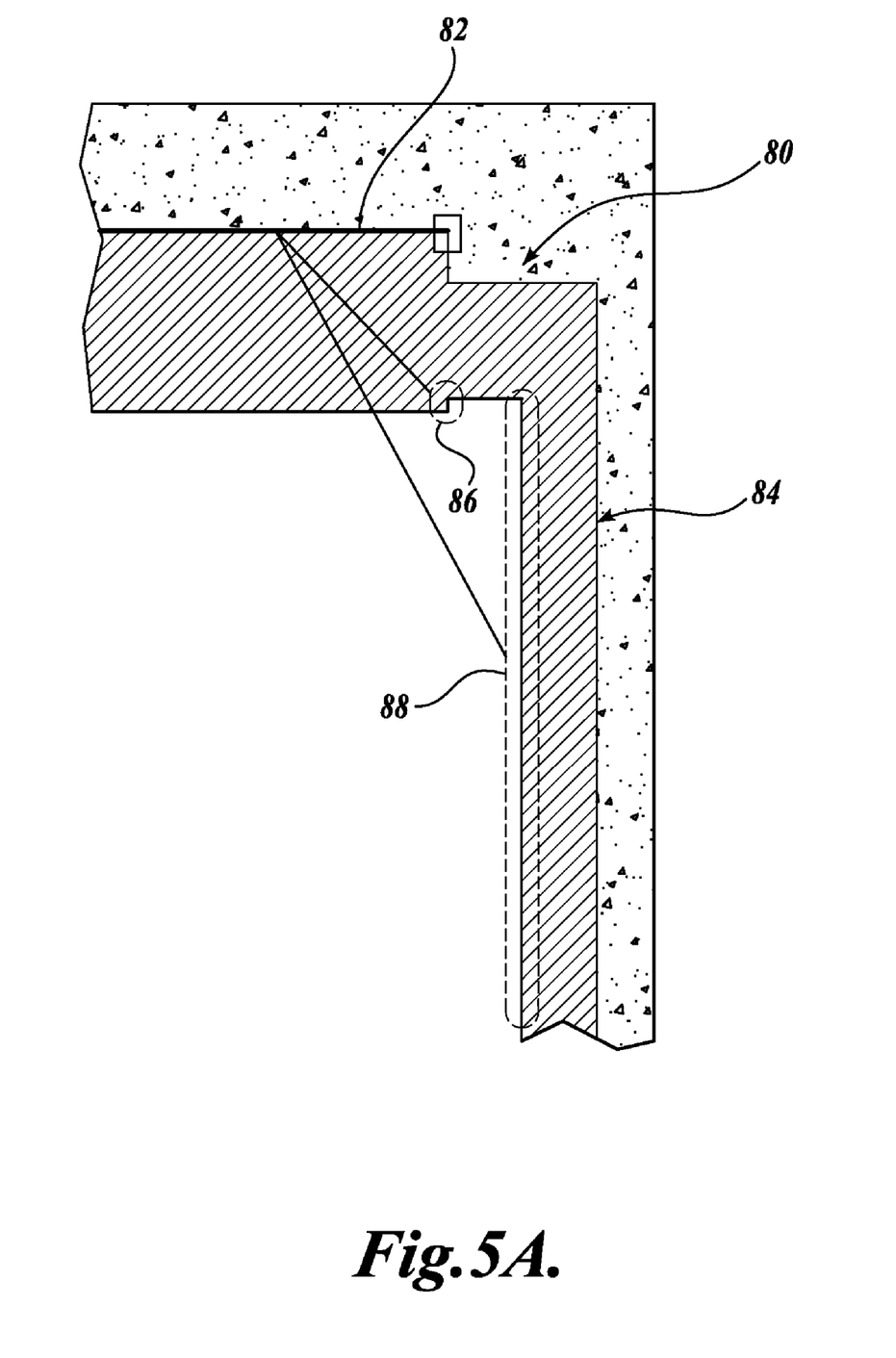
FIGS. 5A and 5B illustrate one exemplary method of improving OPC corrections in accordance with an embodiment of the present invention.
Figure 5B:
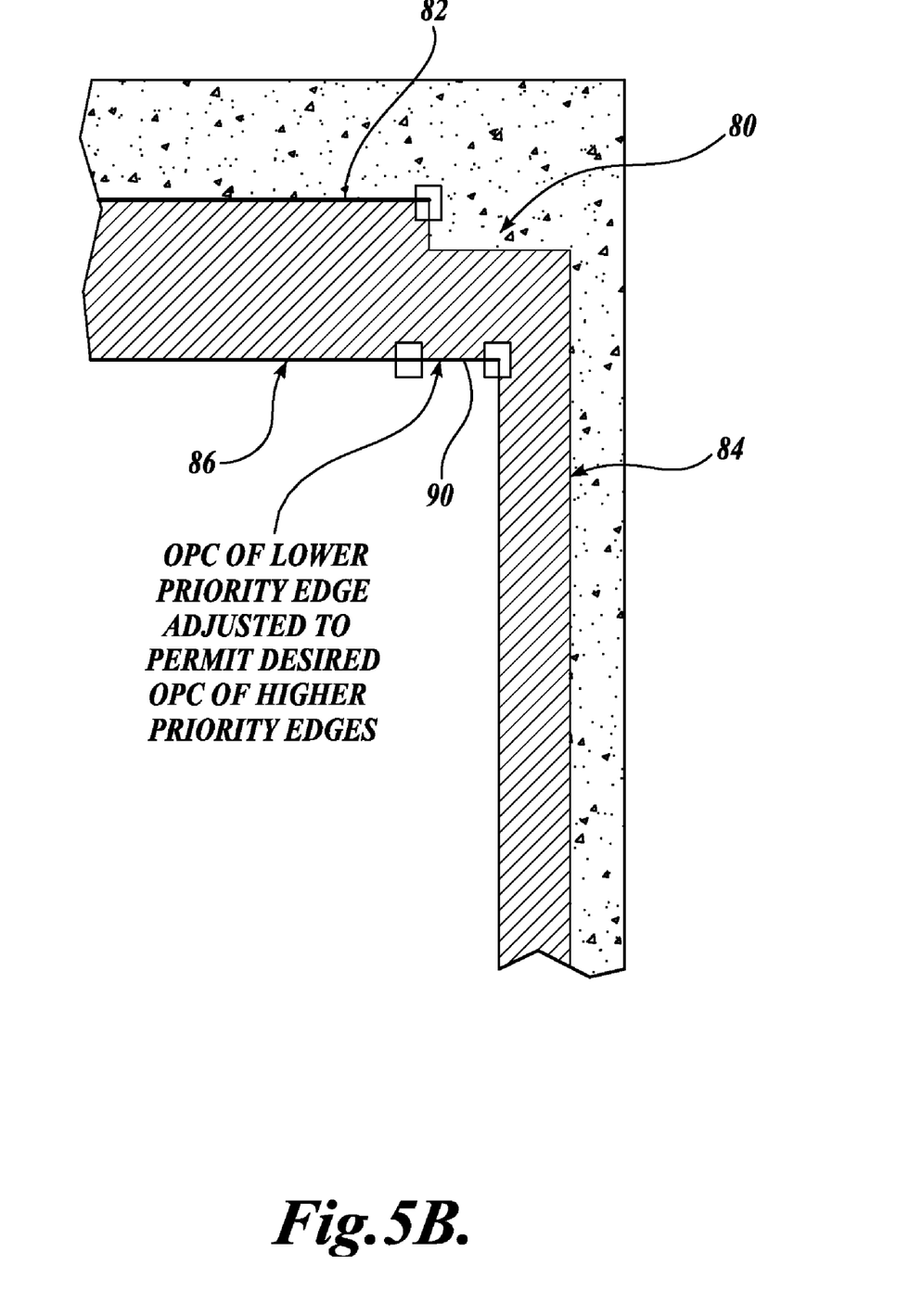

FIGS. 5A and 5B illustrate another common example whereby one edge segment is preventing the OPC correction of another edge segment that may affect circuit performance. In this example, an H-shaped circuit feature includes a stepped region 80 at an inside concave corner of the feature formed between a horizontal edge segment 82 and a vertical edge segment 84. The rule conflict indication system indicates a conflict will occur if the edge segment 82 is moved to its desired OPC corrected position due to a rule violation between an edge segment created at position 86 and the OPC corrected position of the edge segment 84 at position 88.

FIG. 5B illustrates that one solution to the conflict is to move the edge segment associated with the stepped region 80 to a position 90 that is in-line with the final OPC corrected position of the edge segment 82 such that no notches are formed in the concave corner of the feature. In this example, the OPC tool uses a pattern recognition routine or other knowledge base system to determine the cause of the conflict between OPC correction for the edge segment 82 and the OPC correction of the edge segment 84. Alternatively, an algorithmic approach can be used for determining which edge can solve a conflict. For example, an analysis can be performed on the impact that neighboring edges can have as well as determining the impact of altering the correction of a second, lower priority edge that is involved in the conflict.

In many instances the OPC corrections are determined with an iterative process where edges are moved outward or inward until an acceptable solution is found. Therefore, a lower priority edge may be assigned a position during one iteration that prevents an OPC correction for a more important edge before being moved in another iteration to allow the better OPC correction for the higher priority edge.

Figure 6:
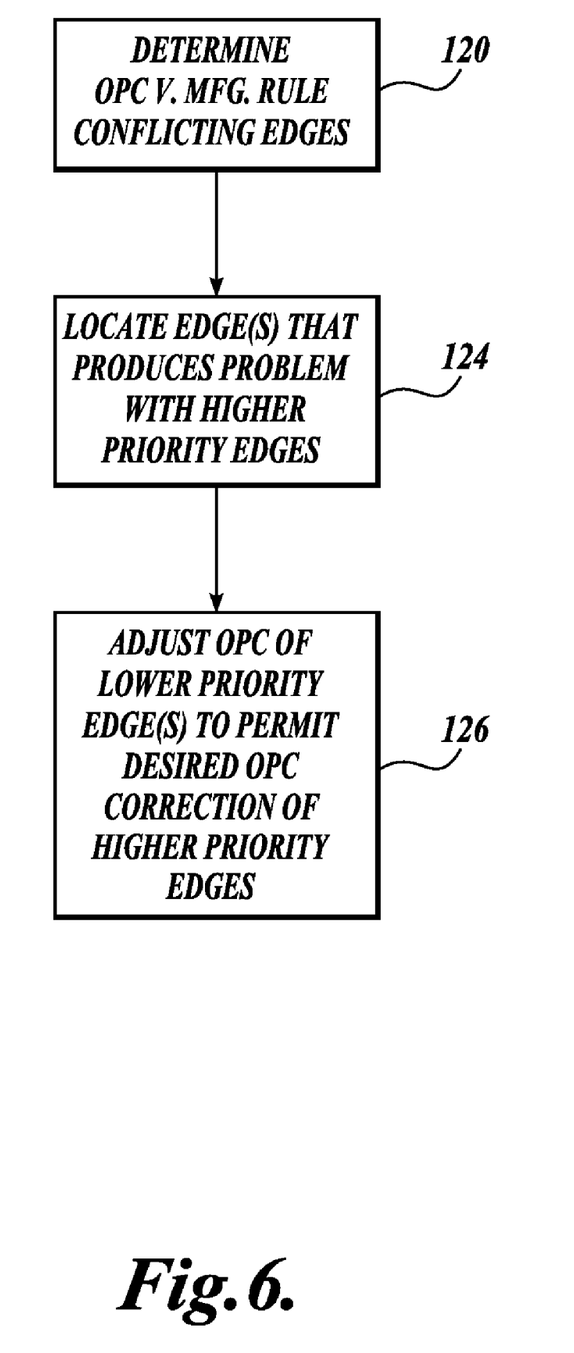
FIG. 6 is a flowchart of a method for improving OPC corrections by assigning a priority to edge segments in accordance with an embodiment of the present invention.

FIG. 6 is a flow diagram of a method of performing optical and process correction in accordance with one embodiment of the present invention. Beginning at 120, a computer system determines the edges for which the OPC corrections and the manufacturing rules conflict. At 124, the higher priority edges are determined. At 126, the OPC correction of a lower priority edges are adjusted to permit the desired OPC adjustment of a higher priority edge. As indicated above, in some instances, the higher priority edges may be moved first followed by the OPC correction of the lower priority edges. Alternatively, the lower priority edges may not receive their full OPC correction or may receive no OPC correction in order to permit an edge with a higher priority to be corrected. In other situations, other edges not directly involved with the conflict may be moved to permit a desired OPC correction of an edge.

Although the present invention has been described with respect to its currently preferred embodiments, it will be appreciated that changes may be made without departing from the scope of the invention. For example, the steps described may be performed in alternative orders. Furthermore, different processing steps may be used to achieve the same functional result. Although the present invention is described with respect to visually highlighting conflicts between an OPC suggested correction and a manufacturing rule, it will be appreciated that other indications such as written, audible or other sensory indications could be produced as well. Therefore, the scope of the invention is to be determined from the following claims and equivalents thereto.

The embodiments of the invention in which an exclusive property or privilege is claimed are defined as follows:

1. A method of performing optical and process correction (OPC) on an integrated circuit (IC) layout, the method comprising:
    determining a pair of edge segments in an IC layout design that will cause a conflict with a manufacturing rule if one or both edge segments of the pair of edge segments receives a desired OPC correction;
    using a computer, assigning each of the edge segments of the pair of edge segments different priority levels, wherein the different priority levels are assigned as a result of the determining; and
    generating one or more OPC corrections for the pair of edge segments, wherein the OPC correction of a lesser priority edge segment does not prevent a desired OPC correction of a higher priority edge segment.

2. The method of claim 1, wherein the generating the one or more OPC corrections comprises generating OPC corrections on lower priority edge segments after higher priority edge segments.

3. The method of claim 1, further comprising assigning a less than desired OPC correction to one or more lower priority edge segments so that one or more higher priority edge segments can be assigned an OPC correction that is or is close to the desired OPC correction.

4. The method of claim 1, wherein the priority levels are assigned as a function of each edge segment's position in a circuit feature.

5. The method of claim 1, wherein the priority levels are assigned as a function of each edge segment's expected edge position error.

6. The method of claim 1, wherein the priority levels are assigned by searching a knowledge base for similar layout patterns that have been previously assigned priority levels.

7. The method of claim 1, wherein the priority levels are assigned as a function of the type of feature being corrected.

8. The method of claim 1, further comprising storing corrected layout data in a computer readable storage device, the corrected layout data being based on the generated OPC corrections.

9. The method of claim 1, further comprising producing an integrated circuit using a mask or reticle designed according to the corrected layout data.

10. One or more computer-readable media storage devices storing a sequence of program instructions that when executed by a computer, cause the computer to perform a method of performing optical and process correction (OPC) on an integrated circuit (IC) layout, the method comprising:
    determining a pair of edge segments in an IC layout design that will cause a conflict with a manufacturing rule if one or both edge segments of the pair of edge segments receives a desired OPC correction;
    assigning each of the edge segments of the pair of edge segments different priority levels, wherein the different priority levels are assigned as a result of the determining; and generating one or more OPC corrections, such that the OPC correction of a lesser priority edge segment does not prevent a desired OPC correction of a higher priority edge segment.

11. The computer-readable storage devices of claim 10, wherein the generating the one or more OPC corrections comprises generating OPC corrections on lower priority edge segments after higher priority edge segments.

12. The computer-readable storage devices of claim 10, wherein the method further comprises assigning a less than desired OPC correction to one or more lower priority edge segments so that one or more higher priority edge segments can be assigned an OPC correction that is or is close to the desired OPC correction.

13. The computer-readable storage devices of claim 10, wherein the priority levels are assigned as a function of each edge segment's position in a circuit feature.

14. The computer-readable storage devices of claim 10, wherein the priority levels are assigned as a function of each edge segment's expected edge position error.

15. The computer-readable storage devices of claim 10, wherein the priority levels are assigned by searching a knowledge base for similar layout patterns that have been previously assigned priority levels.

16. The computer-readable storage devices of claim 10, wherein the priority levels are assigned as a function of the type of feature being corrected.

17. A system for performing optical and process correction (OPC) on an integrated circuit (IC) layout, comprising:
   means for reading at least a portion of an IC layout design;
   means for determining a pair of edge segments in the IC layout design that will cause a conflict with a manufacturing rule if one or both edge segments of the pair of edge segment receives a desired OPC correction;
   means for assigning each of the edge segments of the pair of edge segments different priority levels, wherein the different priority levels are assigned based on the determining; and
   generating corrections such that the OPC correction of a lesser priority edge segment does not prevent a desired OPC correction of a higher priority edge segment.

* * * * *

UNITED STATES PATENT AND TRADEMARK OFFICE
CERTIFICATE OF CORRECTION

PATENT NO. : 7,865,863 B2  Page 1 of 1
APPLICATION NO. : 11/626307
DATED : January 4, 2011
INVENTOR(S) : George P. Lippincott It is certified that error appears in the above-identified patent and that said Letters Patent is hereby corrected as shown below:

In the Claims:

Column 6, claim 10, line 55, "computer-readable media storage devices" should read --computer-readable storage devices--

Column 8, claim 17, line 14, "segment" should read --segments--

Signed and Sealed this
Twenty-eighth Day of June, 2011

David J. Kappos
*Director of the United States Patent and Trademark Office*